(12) United States Patent
Tzlil et al.

(10) Patent No.: US 6,392,891 B1
(45) Date of Patent: May 21, 2002

(54) UTILIZING A CONVECTION COOLED ELECTRONIC CIRCUIT CARD FOR PRODUCING A CONDUCTION COOLED ELECTRONIC CARD MODULE

(75) Inventors: Jacob Tzlil, LeZion; Ronen Zagoory, Ashdod, both of (IL)

(73) Assignee: Elta Electronics Industries Ltd., Ashdod (IL)

( * ) Notice: Subject to any disclaimer, the term of this patent is extended or adjusted under 35 U.S.C. 154(b) by 0 days.

(21) Appl. No.: 09/577,422

(22) Filed: May 22, 2000

(30) Foreign Application Priority Data

Jul. 2, 1999 (IL) .................................................. 130775

(51) Int. Cl.⁷ ................................................ H05K 7/20
(52) U.S. Cl. ...................... 361/719; 257/727; 403/409.1
(58) Field of Search ....................... 174/252; 165/80.3, 165/185; 211/41.17; 257/726, 727; 361/688–690, 704, 707, 709–711, 715, 719–721, 801; 403/409.1

(56) References Cited

U.S. PATENT DOCUMENTS

| 4,536,824 A | 8/1985 | Barrett et al. ................ 361/384 |
| 4,916,575 A | 4/1990 | Van Asten ................... 361/386 |
| 5,010,444 A | 4/1991 | Storrow et al. ............. 361/386 |
| 5,057,968 A | 10/1991 | Morrison ..................... 361/385 |
| 5,177,666 A | 1/1993 | Bland et al. ................ 361/382 |
| 5,339,519 A | 8/1994 | Fortune ......................... 29/840 |
| 5,343,358 A | 8/1994 | Hilbrink ..................... 361/700 |
| 5,764,483 A | 6/1998 | Ohashi et al. ............... 361/699 |
| 5,784,256 A | 7/1998 | Nakamura et al. .......... 361/699 |
| 5,794,454 A | 8/1998 | Harris et al. ................ 62/259.2 |
| 5,844,777 A | 12/1998 | Gates ......................... 361/700 |
| 6,084,776 A | * 7/2000 | Cuntz et al. ................. 361/707 |
| 6,212,075 B1 | * 4/2001 | Habing et al. .............. 361/719 |

FOREIGN PATENT DOCUMENTS

JP          4113695      *  4/1992  ................. 361/720

OTHER PUBLICATIONS

"Circuit Card Cooling Enhancement Device", IBM Technical Disclosure Bulletin, US, IBM Corp., New York, vol. 33, No. 4, Sep. 1, 1990, pp. 103–104, XP000106351, ISSN: 0018–8689, p. 103, paragraph 3—p. 104, paragraph 1; figure.
International Search Report No. PCT/IL 00/00379.

* cited by examiner

Primary Examiner—Gregory Thompson
(74) Attorney, Agent, or Firm—Fitch, Even, Tabin & Flannery (57) ABSTRACT

A conduction cooled electronic card module is designed for insertion into a chassis of an electronic device so as to transfer thereto a heat generated by electronic components of the module. The module comprises a circuit card of a convection cooled type, and a thermally conductive frame carrying the circuit card. The circuit card has a front surface carrying at least a part of the electronic components, and a rear surface at least edge areas of which are adapted to be in thermal contact with the chassis. The frame is in thermal contact with the part of the electronic components and with the front surface of the circuit card at least at edge areas thereof, so as to conduct heat generated by the electronic components, via the edge areas of the front surface to the edge areas of the rear surface of the circuit card.

29 Claims, 6 Drawing Sheets

UTILIZING A CONVECTION COOLED ELECTRONIC CIRCUIT CARD FOR PRODUCING A CONDUCTION COOLED ELECTRONIC CARD MODULE

FIELD OF THE INVENTION

The present invention relates generally to cooling of electronic devices and, in particular, to cooling electronic circuit cards.

BACKGROUND OF THE INVENTION

In conventional electronic devices such as, for example, computer systems, electronic components are mounted on circuit cards, which are assembled into electronic circuit card modules. The circuit card modules are usually inserted into a chassis of an electronic device and, typically, plugged via a connector into an enclosure having a backplane or a motherboard. The circuit card modules may also include additional circuit cards, which are called mezzanine cards. The mezzanine card is electrically connected to the main card via a connector.

There are several standards defining properties of circuit card modules. for instance, VMEbus, SEM-E, PCI, cPCI standards, etc. The standards encompass mechanical specifications such as card dimensions, connector specifications, etc, along with electronic specifications such as bus structures, signal functions, timing, signal voltage levels, and master/slave configurations. These specifications enable different modules of the same standard supplied from different manufacturers to plug into any enclosure of the same standard, and provide for communications between different modules.

Proper cooling of electronic components in general, and those mounted on circuit cards in particular, is essential in electronic devices, wherein excessive heat generated by the electronic components can cause malfunctions and failure thereof. Depending on the manner of cooling, conventional circuit cards and, consequently, circuit card modules, are generally classified under convection cooled and conduction cooled types. In general, in the framework of the same standard, conventional convection and conduction cooled card modules are different in construction, however, both meeting the same standard electronic specifications.

Convection cooled card modules are mounted within chassis of an electronic device in such a way as to allow the free flow of cooling air over electronic components to dissipate excess heat generated. The flow of air is usually provided by fan.

Figure 4:
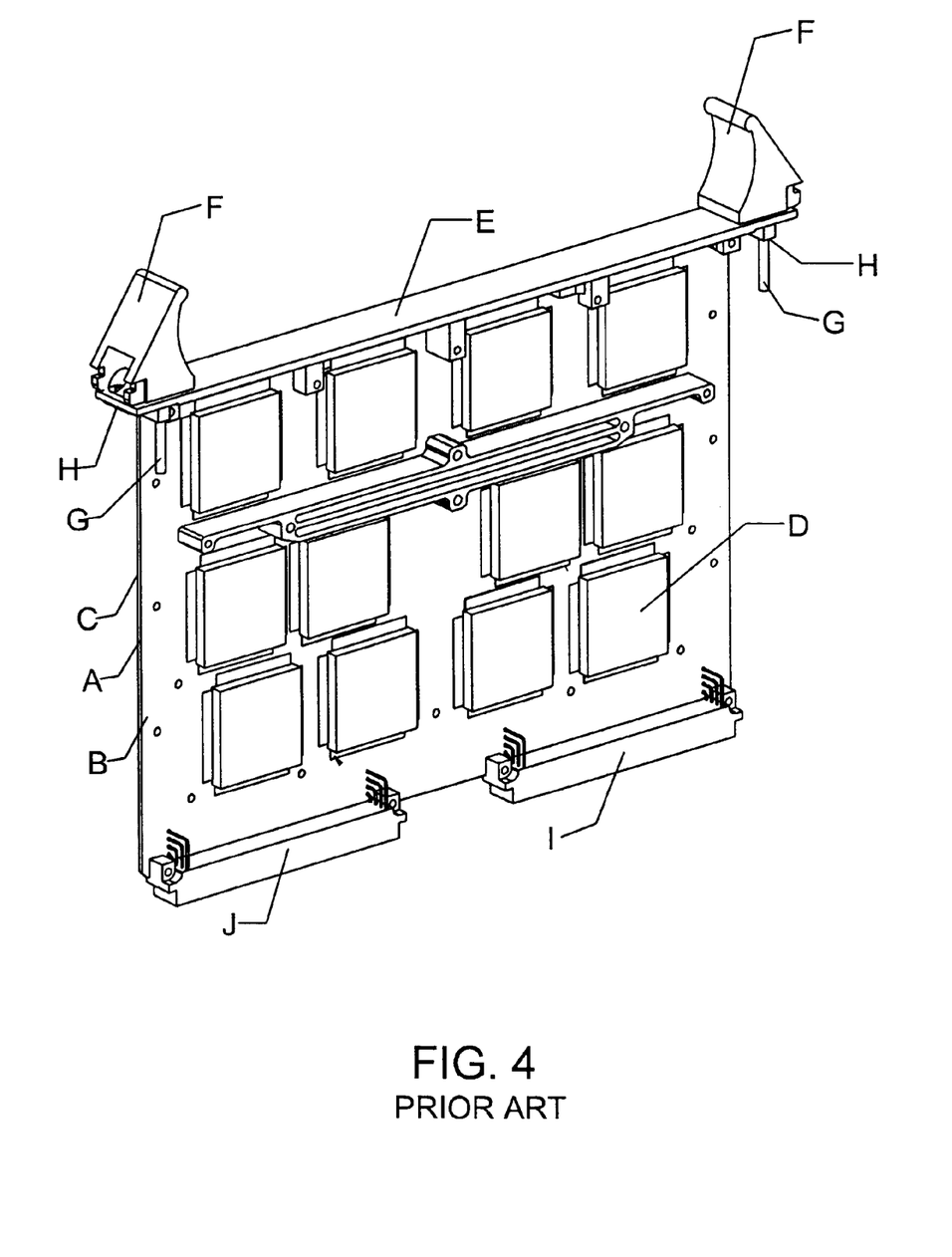
FIG. 4 is an isomeric view of a conventional convection cooled module.

One example of a conventional convection cooled card module of VME64 standard is shown in FIG. 4 of the drawings. The card module shown in FIG. 4 comprises a circuit card A having a front surface B and a rear surface C, at least the front surface bearing electronic components D. The card module further comprises a standard VME interface front panel E mounted to the top of the circuit card A, including extractors F. alignment pins G, and keying provisions H for the insertion of the module in a chassis of an electronic device; and two VMEbus connectors I and J mounted to the bottom of the circuit card A, for the connection thereof to an enclosure that also conforms to the VME64 standard. The main card shown in FIG. 4 also comprises a stiffening rib provided therealong to inhibit vibration of the card in use.

Figure 5:
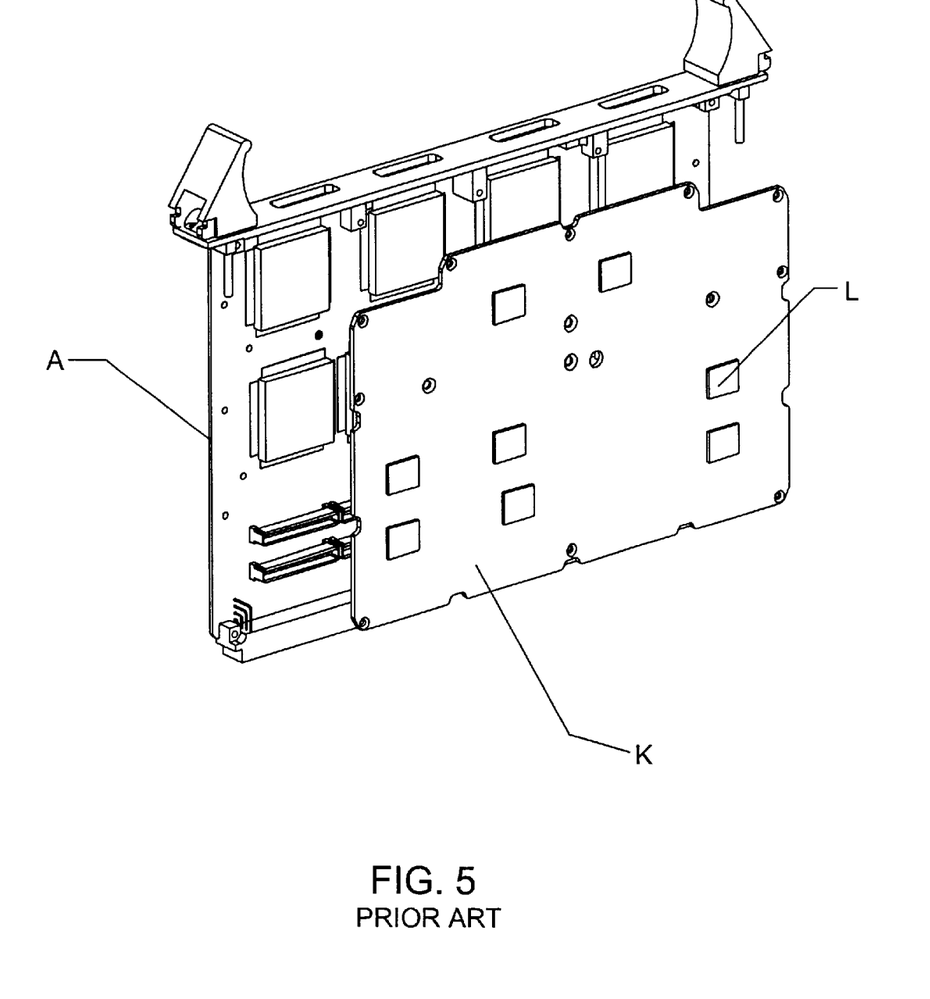
FIG. 5 is an exploded isomeric view of another conventional convection cooled card module including a mezzanine card.

FIG. 5 illustrates another example of a conventional convection cooled card module meeting the same VME64 standard, which in addition to the circuit card A, comprises a mezzanine card K which has electronic components L.

Convection cooled card modules can typically not be used when there are severe requirements for protection of their cards from harsh environment such as sand, dust, humidity, etc. They also cannot be used in closed electronic devices where air ventilation is impossible.

Under the above conditions, conduction cooled card modules are conventionally utilized. In such modules, heat generated by electronic components of a circuit card is absorbed by an internal heat transmitting layer thereof, often made of copper, and thereby forwarded to a dissipation device, being commonly called a heat sink. The function of this device is usually fulfilled by the chassis in which the modules are mounted. Since a conduction cooled circuit card does not require an air exchange over its electronic components, it may be hermetically sealed within its module or rather used in a sealed electronic device, as it happens most often.

However, in conventional conduction cooled modules, the amount of heat that may be withdrawn from electronic components is rather low (about 15–20 watt), in view of which measures are taken to ensure that these cards and their components can withstand high temperatures. This essentially increases the costs of production of conduction cooled modules and, consequently, their price.

Various attempts have been made to improve conduction cooling in conduction cooled circuit cards by providing a plurality of special heat withdrawing devices for their physical attachment to electronic components of the conduction cooled cards. However, this requires connecting the devices to the dissipation device, which may need accurate machining, is time consuming and, particularly, is not suitable for mass production.

Accordingly, it is an object of the present invention to utilize a standard convection cooled circuit card for the production of a novel conduction cooled circuit card module.

SUMMARY OF THE INVENTION

According to one aspect of the present invention, there is provided a conduction cooled electronic card module comprising a circuit card of a convection cooled type of the same standard, having front and rear surfaces and two opposite edges adapted to be received in a chassis of an electronic device. At least the front surface of the circuit card carries electronic components, at least a part of which is capable of generating heat during operation of the module. The rear surface of the circuit card is adapted to be in thermal contact with said chassis at an area of the surface adjacent said edges, when the module is inserted therein. The module further includes a thermally conductive frame on which said circuit card is mounted, so as to be in thermal contact with at least said part of the electronic components and with an edge area of the front surface of the circuit card, adjacent said edges. This enables the heat generated by the electronic components of the circuit card to be transferred to the frame and therefrom, via the edge areas of the front and rear surfaces of the card, to the chassis.

Preferably, the circuit card is provided with a thermal vias at the edge areas thereof. This facilitates the hear transfer from the front surface of the card to its rear surface.

Preferably, the card module further comprises a first heat transfer pad made of thermally conductive material that is sandwiched between the circuit card and the frame. The pad is designed for enhancing the thermal contact between the frame and the electronic components. Therefore, the kind of material of which its pad is made and its thickness are to be chosen so as to ensure the provision of a thermal contact between the pad and the electronic components having various heights. Thus, it is preferable that the pad material is a soft viscoelastic material and it may even be in the form of a gel.

The card module may further comprise at least one mezzanine card as the circuit card. The mezzanine card is attached to said frame so that the frame is sandwiched between the main card and the mezzanine card, the latter being electrically connected to said main card via at least one connector arranged in said frame. The frame is thus adapted to be in thermal contact with electronic components of the mezzanine card to withdraw therefrom heat generated by these components. Preferably, the module further includes a second pad made of thermally conductive elastic material, to be sandwiched between the mezzanine circuit and the frame.

Preferably, the frame has a base surface adapted to be in thermal contact with said electronic components on the front surface of the circuit card and at least two peripheral side walls adapted to be in thermal contact with the edge areas of the front surface of the circuit card. Preferably, the frame has side walls all along the circumference of the base surface so that, if the main card does not have electronic components on its rear surface, its sealing may be achieved by simple attaching said card to the frame. When the rear surface of the circuit card also bears heat generating electronic components, a rear cover should be attached to the frame. A front cover should be used when the mezzanine card has such components on its rear surface. When the rear surfaces of the main and mezzanine cards bear heat generating electronic components, the front and rear covers may serve to transfer heat generated thereby to said frame.

For sealing the main card and, optionally, the mezzanine card in the module, the latter should comprise both rear and front covers attached to said frame, with appropriate gasket sandwiched therebetween. When the module is hermetically sealed, it is protected from humidity and it may be used when there are severe requirements for protection from any harsh environment.

Preferably, both the main card and the mezzanine card of the module meet requirements of a specific standard, and said thermally conductive frame meets corresponding requirements of mechanical specifications of said standard.

In accordance with another aspect of the present invention, there is provided a method of utilizing a convection cooled circuit card for producing a conduction cooled electronic card module.

In accordance with a still further aspect of the present invention, there is provided a kit comprising a convection cooled circuit card and parts to be assembled therewith for producing a conduction cooled card module according to the present invention and a convection cooled card module, both adapted for insertion into a corresponding chassis of an electronic device.

The present invention provides for a conduction cooled card module, which is based on a convection cooled card and is, therefore, much simpler in production and cheaper than the conduction cooled card modules. The significance of the present invention goes beyond the preparation of highly reliable, stable, and cost-effective conduction cooled card modules meeting standard requirements. Since the card modules may be sealed, the modules retain superior performance in harsh environments. The products are better suited for applications needed for ruggedization (for example, the ability to withstand shock and vibration). Additionally, the modules are better suited in systems needed for extended temperature operation and in life-critical and quality-sensitive applications.

BRIEF DESCRIPTION OF THE DRAWINGS

In order to understand the invention and to see how it may be carried out in practice, preferred embodiments will now be described, by way of non-limiting example only, with reference to the accompanying drawings, in which.

DETAILED DESCRIPTION OF PREFERRED EMBODIMENTS

Figure 1:
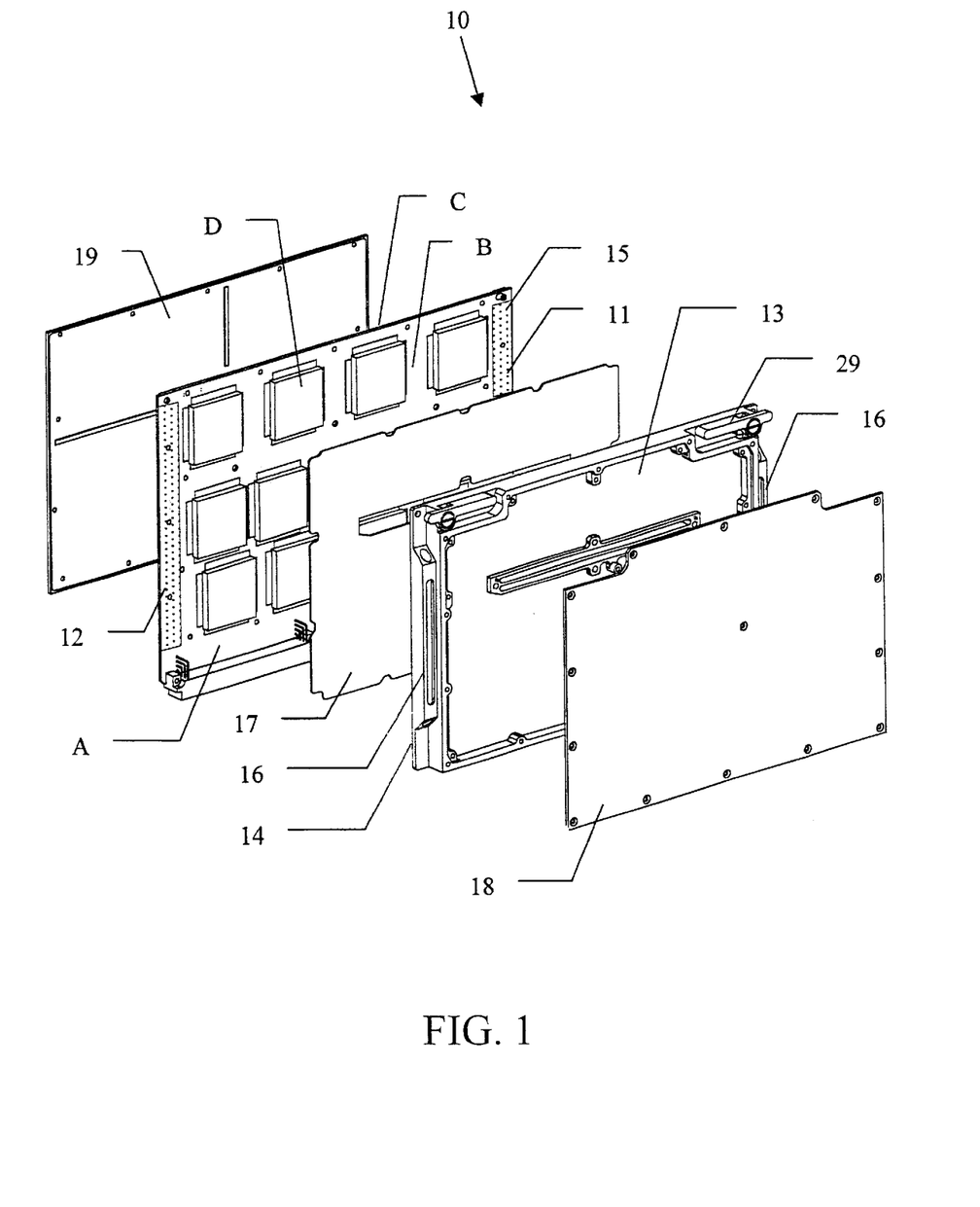
FIG. 1 is an exploded isomeric view of a conduction cooled card module constructed in accordance with one embodiment of the present invention.
Figure 2:
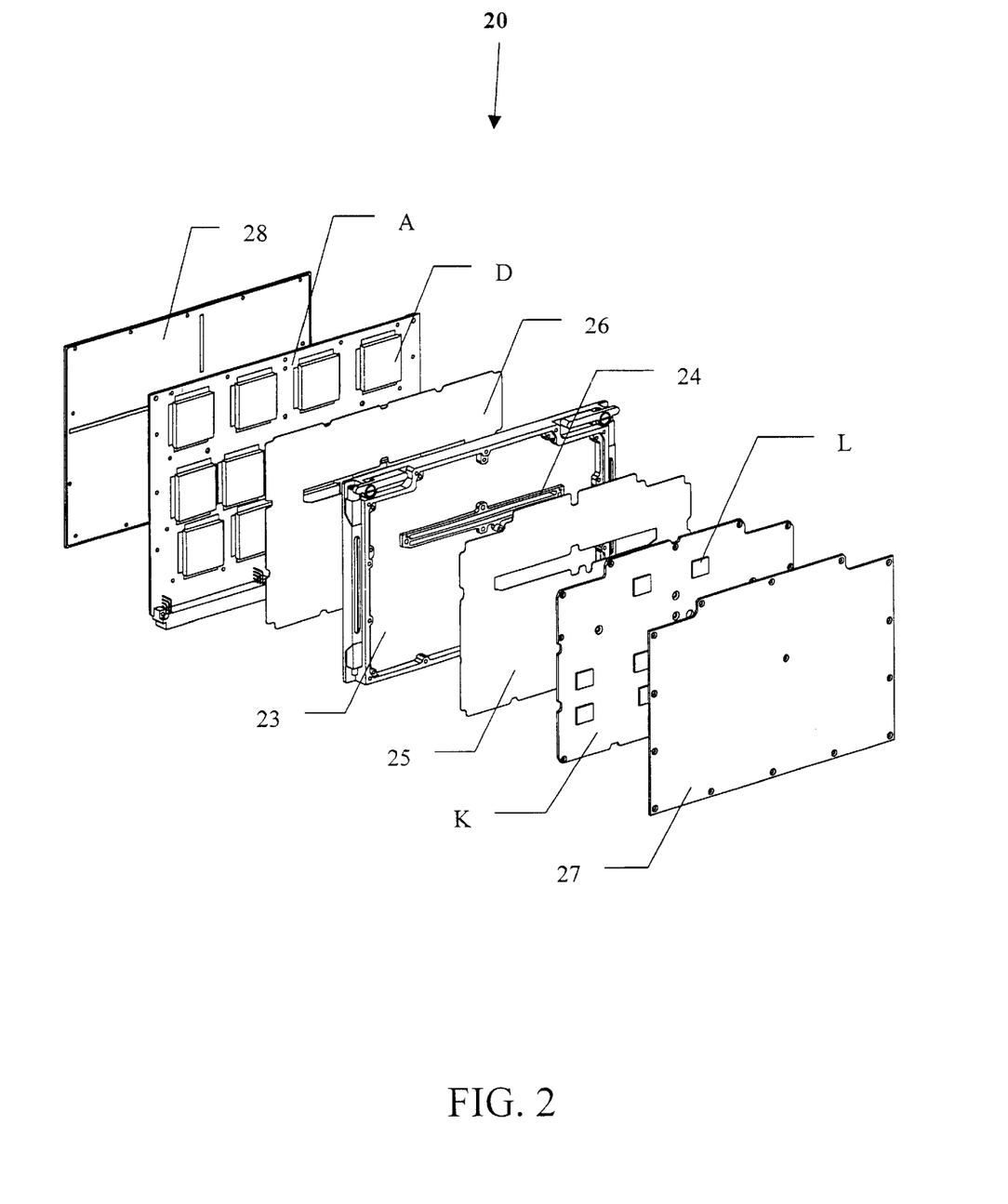
FIG. 2 is an exploded isomeric view of a conduction cooled card module including a mezzanine card and constructed in accordance with another embodiment of the present invention.

FIGS. 1 and 2 illustrate conduction cooled modules 10 and 20, respectively, which in accordance with the present invention are designed to meet requirements of the VMEbus standard (Versa Module Eurocard) and are produced based on a convection cooled circuit card A of the same VMEbus standard, shown in respective FIGS. 4 and 5. The modules 10 and 20 are adapted for insertion into a chassis of an electronic device (not shown), designed for conduction cooled card modules.

The circuit card A has front and rear surfaces B and C, at least the former bearing electronic components D. In order to meet specifications of conduction cooled modules of the above of the VMEbus standard, the rear surface C of the circuit card A is adapted for thermal contact with the chassis, at edge areas 11 and 12 of the rear surface C. In particular, the rear surface C is provided, at the edge areas 11 and 12, with edge guides (not seen) extending along the left and right edges thereof.

The circuit card A is further provided with a thermal vias in the form of a plurality of thermally conductive microbores 15 formed between the front and rear surfaces B and C and localized at the edge areas 11 and 12 thereof to be associated with the edge guides.

The conduction cooled module 10 shown in FIG. 1, further includes a thermally conductive frame 13 mating in format with the circuit card A. A central area (not seen) of a front surface of the frame 13, facing the circuit card A, is adapted to be in thermal contact with the electronic components D of the circuit card A. A peripheral area 14 of the front surface of the frame 13 is adapted to be in thermal contact with the front surface B of the card in the area of the microbores 15.

The frame 13 comprises a pair of wedge locks 16 mounted on a rear surface of the frame 13 at side edge areas thereof, and a pair of extractors 29 mounted at an upper edge area of the rear surface of the frame 13, which are designed for facilitating the insertion/extraction of the module 10 in/from the chassis of an electronic device.

The conduction cooled module 10 further includes a heat transfer pad 17 made of a thermally conductive viscoelastic material, to be sandwiched between the circuit card A and the frame B so as to enhance thermal contact between the frame 13 and the electronic components D mounted on the front surface B of the circuit card A. The kind of the pad material and its thickness are to be chosen so as to ensure the provision of a thermal contact between the pad and the electronic components having various heights. It is therefore preferable that the pad material is a soft viscoelastic material and, when the difference in heights between the electronic components D is essential, this material may even be in the form of a gel.

The conduction cooled module 10 further includes front and rear covers 18 and 19, respectively. adapted to seal the circuit card A within the module 10. For this purpose, the module may further comprise gaskets to be sandwiched between the covers 18 and 19 and the frame 16. When the rear surface C. of the card A has heat generating electrical components thereon, the rear cover 19 is used also to transfer the heat generated by these components to the frame.

The card module 10 shown in FIG. 1 is assembled by mounting the circuit card A to the frame 13 with the pad 17 sandwiched therebetween so as to provide a thermal contact between the central area of the frame 13 and the electrical components D mounted on the front surface C. In addition. a thermal contact is provided between the peripheral area 14 of the front surface of the frame 13 and the front surface B of the card A in the area of the microbores 15. The front and rear covers 18 and 19, respectively, are attached to the frame 13, optionally with the gaskets sandwiched therebetween.

The conduction cooled card module 20 shown in FIG. 2, differs from the card module 10 shown in FIG. 1, in that, in addition to the standard circuit card A which constitutes its main card, it comprises a mezzanine card K of the same standard, which is shown in FIG. 5. The mezzanine card K is to be attached to a frame 23 so that this frame is sandwiched between the main circuit card A and the mezzanine card K. The mezzanine card K, which carries electronic components L at least at its front surface facing the frame 23, is adapted to be electrically connected to the main circuit card A via a connector 24 that is arranged in the frame 23.

The card module 20 may further comprise a heat transfer pad 25 made of a thermally conductive elastic material, similar to the pad 17 described above, to be sandwiched between the mezzanine card K and the frame 23 for enhancing the thermal contact between the frame 23 and the electronic components of the mezzanine card K.

The conduction cooled model 20 further includes front and rear covers 27 and 28, respectively, to be attached to the frame 23 for sealing the circuit card A and the mezzanine card K within the module 20. In the present embodiment, the mezzanine card K carries electronic components L also on its rear surface facing the front cover 27 and a thermal contact is provided between the front cover 27 and the electronic components L.

Figure 3A:
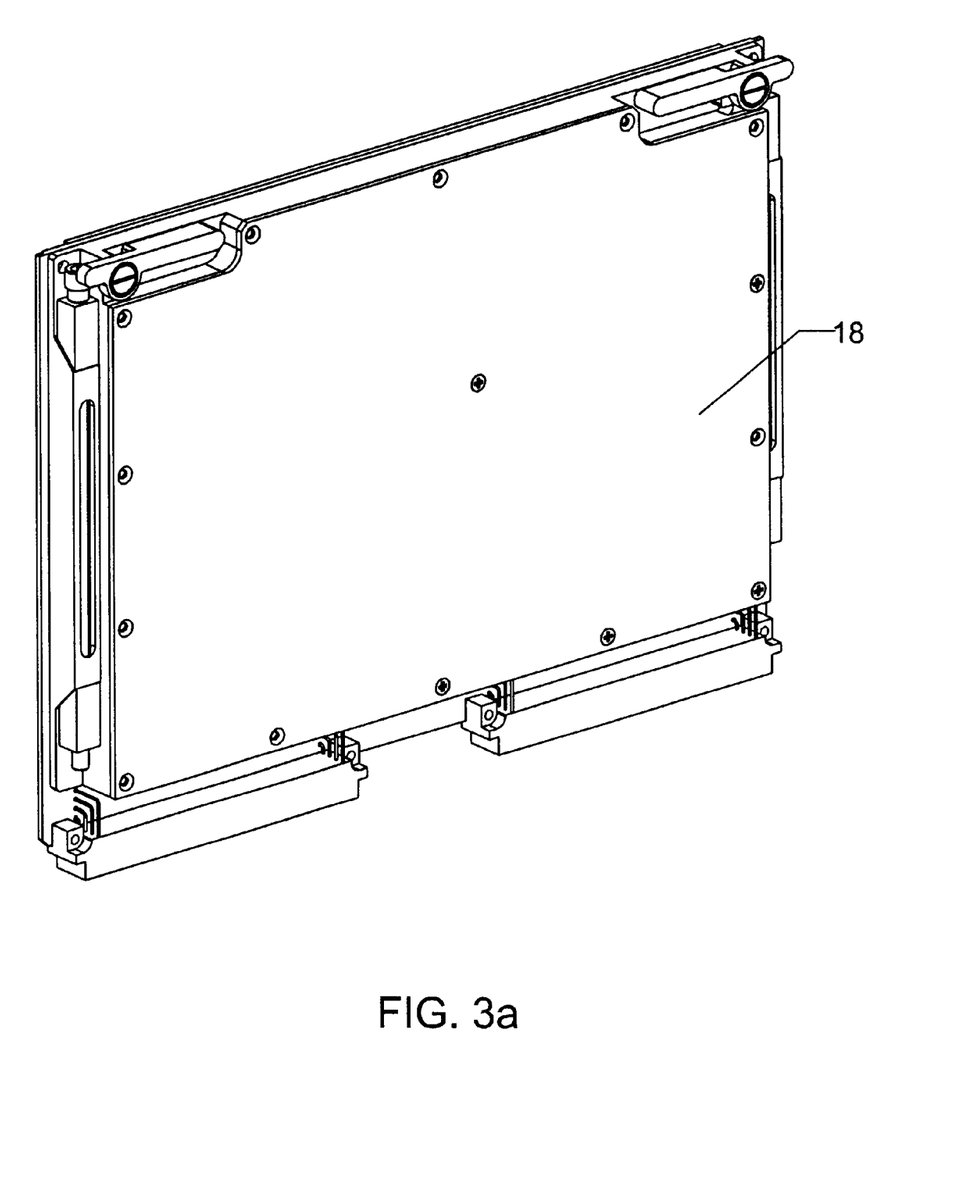
FIG. 3a is an isomeric front view of the assembled conduction cooled card module shown in FIG. 1 or FIG. 2.
Figure 3B:
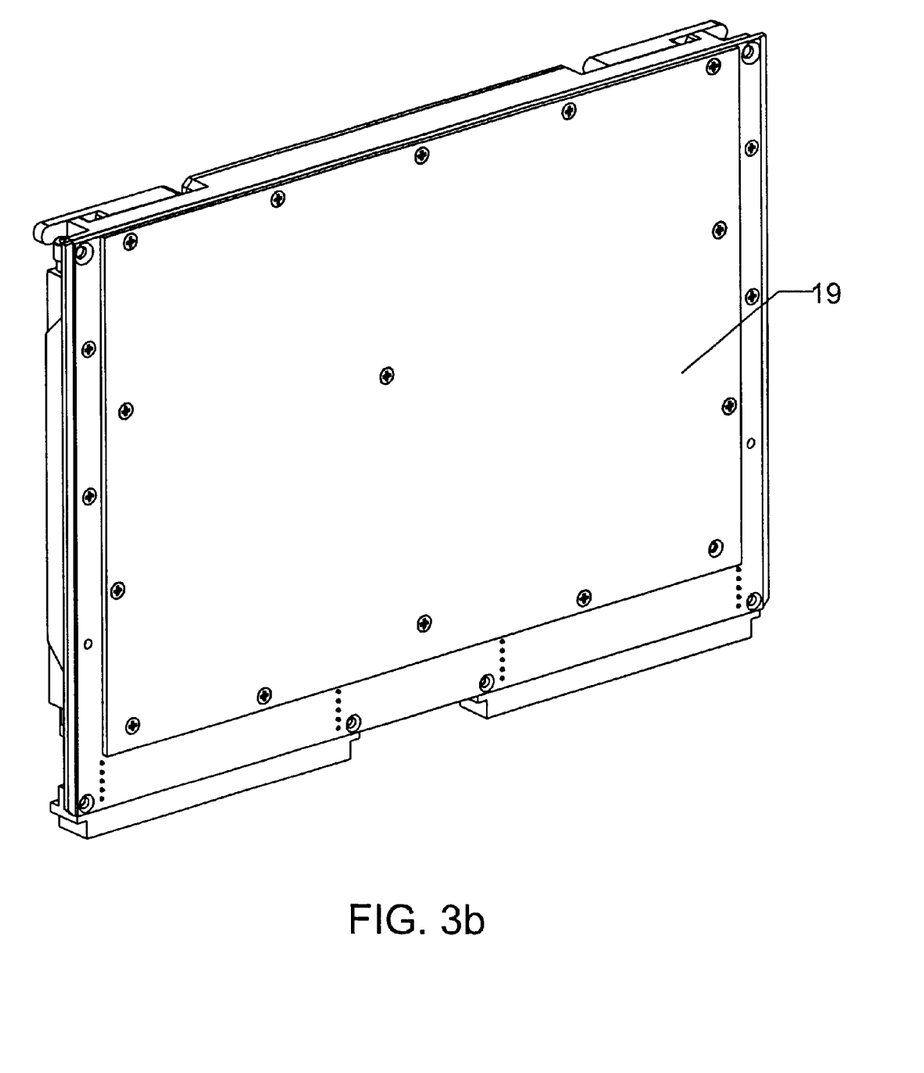
FIG. 3b is an isomeric rear view of the assembled conduction cooled card module shown in FIG. 1 or FIG. 2.

FIGS. 3a and 3b show, respectively, front and rear views of the assembled conduction cooled card module 10 or 20. As seen, the module is hermetically sealed and it may be used when there are severe requirements for protection from any harsh environment.

When the card module 10 is in operation, the heat generated by the electronic components D mounted on the front surface B of the circuit card A is transferred through the first heat transfer pad 17 and the frame 13 to the front surface B of the card A at the area of the thermal vias 15 and, therethrough, to the rear surface C of the card which transfers the heat to the chassis of an electronic device. If the electronic components are mounted also on the rear surface C of the circuit card A, the heat generated thereby is transferred via the rear cover 19 to the frame 13 and therefrom to the rear surface C of the circuit card A and to the chassis.

The card module 20 operates similarly to the card module 10. In addition. heat generated by the electronic elements L of the mezzanine card K is transferred to the frame 23 via the second heat transfer pad 25, and then to the rear surface 14 of the main circuit card A.

It should be appreciated that the present invention enables utilizing a standard convection cooled circuit card used for producing a standard convection cooled module, in the production of a conduction cooled module meeting all standard requirements. Consequently, such a circuit card, together with parts of these modules that are necessary for their assembling, may be combined in a kit. Various configurations of such kits are possible according to the invention. For example, in a most complete configuration, the kit may comprise the circuit card A, the mezzanine card K, a frame, first and second pads, front and rear covers and two gaskets. for the assembly of conduction cooled card modules such as 10 in FIG. 1 or 20 in FIG. 2; and an interface front panel E with all appropriate appliances for the assembly of convection cooled card modules such as shown in FIG. 4 or FIG. 5.

As it should be understood by a man of the art, the invention is not confined to the precise details of the foregoing examples and variations may be made thereto. Hence, the circuit cards of VMEbus standard used in the description of the preferred embodiment were used as a non-limiting example of implementation of the present invention. The present invention should not be considered as being limited to the use of any particular standard. A similar solution can be implemented on the circuit cards of any other conventional design or appropriate standard, for example, SEM-E, PCI or cPCI circuit card standards and their modifications. It may also be designed in a non-standard format.

Also, it should be clear to a versed man that, though the thermal vias providing a convection heat transfer between the front and rear surfaces of the circuit card A, are desirable for improving the heat transfer between these surfaces, they can be omitted. Alternatively, they may be converted into thermal conductive channels by filling the microbores with a conductive material. Further, the module may be designed without the heat transfer pad or rather this pad need not be of elastic only, but may be of metal, for example, aluminium, copper, or another good thermal conductor.

Also, the frame may be not only in the form of a continues solid body, but it may be of hollow design. In accordance with the later design, the frame can be cooled by passing therethrough an air or a coolant fluid.

Other variations are possible within the scope of the present invention as defined in the appended claims.

LIST OF REFERENCES USED IN THE DRAWINGS

A—convection cooled circuit card
B—front surface of the circuit card A
C—rear surface of the circuit card A
D—electronic components
E—interface front panel
F—extractors
G—alignment pins H—keying provisions
I, J—connectors
K—mezzanine card
L—electronic components of the mezzanine card K
10—conduction cooled module in FIG. 1
11,12—edge areas of the rear surface C
13—thermally conductive frame of the module 10
14—peripheral area of the surface of the frame 13
15—microbores
16—wedge locks of the frame 13
17—heat transfer pad of the module 10
18, 19—front and rear covers of the module 10
20—conduction cooled module in FIG. 2
23—thermally conductive frame of the module 20
24—connector of the module 20
25—heat transfer pad of the module 20
27, 28—front and rear covers of the module 20
29—extractors of the frame 13

What is claimed is:

1. A conduction cooled electronic card module comprising:
    (a) a convection cooled circuit card designed for mounting in a convection cooled card module chassis of an electronic device, the card having a front surface carrying at least a part of said electronic components, a rear surface and edge areas free of said components, wherein at least one of the edge areas has a plurality of thermal vias formed therethrough from the front surface to the rear surface; and
    (b) a thermally conductive frame carrying said circuit card and having a front surface in direct contact with said part of the electronic components and with said front surface of the circuit card at least at edge areas thereof including the edge area having the plurality of thermal vias such that at least some of the thermal vias are in direct contact with the thermally conductive frame;
such that said frame is adapted for conducting heat generated by said electronic components, via the edge areas of the front surface and at least some of the thermal vias to said edge areas of the rear surface of the circuit card, and wherein said module is adapted for the insertion in a chassis designed for conduction cooled card modules, by means of said frame, so that said edge areas of the circuit card and at least some of the thermal vias are received in said chassis in thermal contact therewith to transfer to the chassis heat generated by electronic components of the module.

2. A module according to claim 1, wherein said frame is metallic.

3. A conduction cooled module as defined in claim 1, wherein said thermal vias are microbores adapted for providing a convection heat transfer from the front surface of the said circuit card to said edge area of the rear surface of said circuit card.

4. A module according to claim 1, further comprising a first heat transfer pad made of a thermally conductive material sandwiched between said circuit card and said frame, for enhancing the thermal contact between the frame and at least said part of the electronic components.

5. A module according to claim 4, wherein said material is viscoelastic and is capable of providing said thermal contact with the electronic components having various heights.

6. A module according to claim 1, wherein said circuit card is a main card of the module which additionally comprises at least one mezzanine card carrying electronic components at least on its front surface, and attached to said frame so that the frame is sandwiched between the main card and the front surface of the mezzanine card, the latter being electrically connected to said main card via at least one connector arranged in said frame.

7. A module according to claim 6, further comprising a second heat transfer pad made of a thermally conductive material and sandwiched between said mezzanine circuit card and said frame, for enhancing the thermal contact therebetween.

8. A module according to claim 7, wherein said material is viscoelastic and is adapted for providing said thermal contact with the electronic components having various heights.

9. A module according to claim 6, wherein said frame further comprises a slit for said connector.

10. A module according to claim 1, further comprising front and rear covers attached to said frame, for sealing the module with said circuit card therein.

11. A module according to claim 6, further comprising front and rear covers attached to said frame, for sealing the module with said main card and mezzanine card therein.

12. A module according to claim 6, wherein the main card and the mezzanine card of the module meet requirements of a specific standard, and said thermally conductive frame meets requirements of mechanical specifications of said standard, defined for card modules.

13. A conduction cooled module as defined in claim 1, wherein said specific standard is one of the VMEbus and SEM-E, PCI and cPCI circuit card standards or their modifications.

14. A method of utilizing a convection cooled circuit card designed for mounting in a convection cooled card module chassis of an electronic device, for producing a conduction cooled electronic card module adapted for the insertion thereof into a chassis of an electronic device designed for conduction cooled card modules, the circuit card having front and rear surfaces with edge areas, wherein at least one of the edge areas includes thermal vias formed therethrough from the front to the rear surface, and carrying heat generating electronic components at least at its front surface, the method comprising the steps of:
    (a) providing a thermally conductive frame for bearing said circuit card; and
    (b) assembling the electronic card module by mounting said circuit card to said frame so as to provide a thermal contact between said frame and said electrical components mounted on the front surface, and a thermal contact, between the frame and said front surface of the card at least at the edge areas of said front surface, including at least some of the thermal vias,
such that the frame is adapted for conducting heat generated by said electronic components via edge areas of the front surface and at least some of the thermal vias, to said edge areas of the rear surface of the circuit card, and wherein said module is adapted for the insertion in said chassis designed for conduction cooled card modules, by means of said frame, so that said edge areas of the circuit card and at least some of the thermal vias are received in said chassis in thermal contact therewith to transfer to the chassis heat generated by electronic components of the module.

15. A method as defined in claim 14, wherein said thermal vias are in the form of microbores adapted for providing a convection heat transfer from the front surface of said circuit card to said edge areas of the rear surface of said circuit card.

16. A method according to claim 14, further comprising a step of providing thermally conductive guides and mounting them at said edge areas of the rear surface of the circuit card.

17. A method according to claim 14, further comprising the steps of:
    (iii) providing a first heat transfer pad made of a thermally conductive material; and
    (iv) sandwiching said pad between the front surface of said circuit card and said frame,
    wherein enhancement of the thermal contact between the frame and the electronic components of said front surface is provided.

18. A method as defined in claim 14, wherein said circuit card constitutes a main card of the module, the method further comprising the steps of:
(v) providing a mezzanine circuit card carrying electronic components at least on its front surface;
(vi) mounting the mezzanine circuit card to said frame so as to provide a thermal contact between the electronic components of said front surface of the mezzanine card and the frame;
(vii) providing a connector for connecting said mezzanine card with said main circuit card:
(viii) mounting said connector on said frame; and
(ix) providing an electrical connection between the main circuit card and the mezzanine card via said connector.

19. A method according to claim 18, further comprising the steps of:
(x) providing a second heat transfer pad made of a thermally conductive material; and
(xi) sandwiching said second pad between the electronic components of said front surface of the mezzanine card and said frame.

20. A method as defined in claim 14, further comprising the steps of:
(xii) providing front and rear covers; and
(xiii) attaching said covers to said frame for sealing the module with said circuit card therein.

21. A method as defined in claim 18, further comprising the steps of:
(xiv) providing front and rear covers; and
(xv) attaching said covers to said frame for sealing the module with said main card and mezzanine card therein.

22. A conduction cooled electronic card module comprising:
(a) a convection cooled circuit card having a front surface carrying at least a part of said electronic components, a rear surface and edge areas free of said components, and wherein at least some of the edge areas has a plurality of thermal vias disposed therethrough from the front surface to the rear surface;
(b) a thermally conductive frame carrying said circuit card;
(c) a first heat transfer pad made of a thermally conductive material sandwiched between said circuit card and said frame and being in direct contact with said part of electronic components, for enhancing the thermal contact between the frame and at least said part of the electronic components;
such that said frame is adapted for conducting heat generated by said electronic components, via the edge areas of the front surface and at least some of the thermal vias to said edge areas of the rear surface of the circuit card, and wherein said module is adapted for the insertion in a chassis designed for conduction cooled card modules, by means of said frame, so that said edge areas of the circuit card and at least some of the plurality of thermal vias are received in said chassis in thermal contact therewith to transfer to the chassis heat generated by electronic components of the module.

23. A module according to claim 22, wherein said material is viscoelastic and is adapted for providing said thermal contact with the electronic components having various heights.

24. A module according to claim 23, wherein said circuit card is a main card of the module which additionally comprises at least one mezzanine card carrying electronic components at least on its front surface, and attached to said frame so that the frame is sandwiched between the main card and the front surface of the mezzanine card, the latter being electrically connected to said main card via at least one connector arranged in said frame.

25. A module according to claim 24, further comprising a second heat transfer pad made of a thermally conductive material and sandwiched between said mezzanine circuit card and said frame, for enhancing the thermal contact therebetween.

26. A module according to claim 25, wherein said material is viscoelastic and is adapted for providing said thermal contact with the electronic components having various heights.

27. A method of utilizing a convection cooled circuit card designed for the insertion in a convection cooled card module chassis of an electronic device, for producing a conduction cooled electronic card module adapted for the insertion thereof into a chassis of an electronic device designed for conduction cooled card modules, the circuit card having front and rear surfaces with edge areas wherein at least one of the edge areas has a plurality of thermal vias formed therethrough from the front surface to the rear surface, and carrying heat generating electronic components at least at its front surface, the method comprising the steps of:
(One) providing a thermally conductive frame for bearing said circuit card;
(Two) providing a first heat transfer pad made of a thermally conductive material;
(c) sandwiching said pad between the front surface of said circuit card and said frame, so as to provide a direct contact between said pad and said electrical components mounted on the front surface, and thereby to provide a thermal contact between the frame and said front surface of the card at least at the edge areas of said front surface and at at least some of the thermal vias, such that the frame is adapted for conducting heat generated by said electronic components via edge areas of the front surface and at least some of the thermal vias, to said edge areas of the rear surface of the circuit card, and wherein said module is adapted for the insertion in said chassis designed for conduction cooled card modules, by means of said frame, so that said edge areas of the circuit card and at least some of the thermal vias are received in said chassis in thermal contact therewith to transfer to the chassis heat generated by electronic components of the module.

28. A method as defined in claim 27, wherein said circuit card constitutes a main card of the module, the method further comprising the steps of:
(d) providing a mezzanine circuit card carrying electronic components at least on its front surface;
(e) mounting the mezzanine circuit card to said frame so as to provide a thermal contact between the electronic components of said front surface of the mezzanine card and the frame;
(f) providing a connector for connecting said mezzanine card with said main circuit card;
(g) mounting said connector on said frame; and
(h) providing an electrical connection between the main circuit card and the mezzanine card via said connector.

29. A method according to claim 28, further comprising the steps of:
(i) providing a second heat transfer pad made of a thermally conductive material; and
(j) sandwiching said second pad between the electronic components of said front surface of the mezzanine card and said frame.

* * * * *